(12) United States Patent
Kuo et al.

(10) Patent No.: US 9,743,513 B2
(45) Date of Patent: Aug. 22, 2017

(54) FLEXIBLE ELECTRONIC DEVICE

(71) Applicant: INDUSTRIAL TECHNOLOGY RESEARCH INSTITUTE, Hsinchu (TW)

(72) Inventors: Shu-Wei Kuo, Zhubei (TW); Kuo-Lung Lo, New Taipei (TW); Cheng-Che Wu, New Taipei (TW); Chen-Chu Tsai, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 189 days.

(21) Appl. No.: 14/583,235

(22) Filed: Dec. 26, 2014

(65) Prior Publication Data

US 2016/0192478 A1    Jun. 30, 2016

(51) Int. Cl.
H05K 1/02 (2006.01)
H05K 1/18 (2006.01)
H05K 3/00 (2006.01)
H05K 3/28 (2006.01)

(52) U.S. Cl.
CPC ......... *H05K 1/0281* (2013.01); *H05K 3/007* (2013.01); *H05K 1/189* (2013.01); *H05K 3/284* (2013.01); *H05K 2201/10106* (2013.01); *H05K 2201/10166* (2013.01); *H05K 2201/2009* (2013.01); *H05K 2203/1316* (2013.01)

(58) Field of Classification Search
CPC ...... H05K 1/0281; H05K 1/028; H05K 3/007; H05K 1/189; H05K 3/284
See application file for complete search history.

(56) References Cited

U.S. PATENT DOCUMENTS 2,694,871 A * 11/1954 Rollman ............... A43B 13/38
264/46.5
6,195,260 B1 * 2/2001 Moriyama .......... H01L 23/5387
174/254
7,238,550 B2 * 7/2007 Peddle ................. B82Y 10/00
257/E21.505

(Continued)

FOREIGN PATENT DOCUMENTS

CN    102176435 A    9/2011
CN    102931136 A    2/2013

(Continued)

OTHER PUBLICATIONS

Ciccotti et al. "Complex dynamics in the peeling of an adhesive tape", International Journal of Adhesion & Adhesives 24 (2004) 143-151.

(Continued)

*Primary Examiner* — Nathan Milakovich
(74) *Attorney, Agent, or Firm* — Birch, Stewart, Kolasch & Birch, LLP

(57) ABSTRACT

According to embodiments of the disclosure, a flexible electronic device is provided. The flexible electronic device includes a flexible substrate, at least one component and at least one stress buffer. The component may be disposed on the flexible substrate and having a lateral surface. The stress buffer may be disposed adjacent to the lateral surface of the component and has a stiffness which is getting larger toward the component.

15 Claims, 11 Drawing Sheets

(56) References Cited

U.S. PATENT DOCUMENTS

| | | | |
|---|---|---|---|
| 7,342,180 B2* | 3/2008 | Ko | G02F 1/13452 174/260 |
| 7,378,685 B2* | 5/2008 | Lee | H01L 51/5246 257/678 |
| 7,746,234 B2* | 6/2010 | Baba | G06K 19/077 235/492 |
| 7,772,770 B2* | 8/2010 | Kim | G02F 1/13452 313/504 |
| 7,868,545 B2* | 1/2011 | Hioki | G02F 1/133305 257/59 |
| 8,098,486 B2* | 1/2012 | Hsiao | G02F 1/133305 349/153 |
| 8,508,706 B2* | 8/2013 | Minami | H01J 9/261 349/153 |
| 8,816,212 B2* | 8/2014 | Hu | G02F 1/13452 174/254 |
| 8,858,007 B2* | 10/2014 | Kim | H05K 1/0203 362/613 |
| 2008/0055831 A1* | 3/2008 | Satoh | G02F 1/133305 361/600 |
| 2009/0184919 A1* | 7/2009 | Shinn | G02F 1/167 345/107 |
| 2010/0117531 A1* | 5/2010 | Park | H01L 51/5246 313/512 |
| 2010/0208188 A1* | 8/2010 | Tsai | G02F 1/133305 349/153 |
| 2010/0302478 A1* | 12/2010 | Nakagawa | G02B 6/0091 349/62 |
| 2011/0204497 A1* | 8/2011 | Matsuda | H01L 21/563 257/669 |
| 2011/0235160 A1* | 9/2011 | Hsieh | G02F 1/133305 359/296 |
| 2011/0242448 A1* | 10/2011 | Oohira | G02F 1/133615 349/60 |
| 2012/0049343 A1* | 3/2012 | Schulze | H01L 24/11 257/737 |
| 2012/0055699 A1* | 3/2012 | Lee | H05K 1/0281 174/254 |
| 2012/0120364 A1* | 5/2012 | Wu | G02F 1/1339 349/153 |
| 2013/0088671 A1* | 4/2013 | Drzaic | G02F 1/13452 349/106 |
| 2013/0100392 A1* | 4/2013 | Fukushima | G09F 9/30 349/150 |
| 2013/0135830 A1 | 5/2013 | Lai et al. | |
| 2013/0248826 A1* | 9/2013 | Kim | H05K 1/0281 257/40 |
| 2013/0341075 A1* | 12/2013 | Becker | H05K 1/0281 174/255 |
| 2014/0099742 A1 | 4/2014 | Yamazaki et al. | |
| 2014/0217382 A1* | 8/2014 | Kwon | H01L 51/0097 257/40 |
| 2014/0240932 A1* | 8/2014 | Hsu | H05K 1/189 361/749 |
| 2014/0323237 A1* | 10/2014 | Beno | A63B 53/04 473/332 |
| 2015/0070840 A1* | 3/2015 | Rappoport | G06F 1/1633 361/679.56 |
| 2015/0092362 A1* | 4/2015 | Ahn | H05K 1/189 361/749 |
| 2015/0304779 A1* | 10/2015 | Lin | H04R 17/00 381/190 |
| 2015/0361551 A1* | 12/2015 | Su | C23C 16/45544 361/679.01 |
| 2016/0143130 A1* | 5/2016 | Wu | H05K 1/028 361/749 |

FOREIGN PATENT DOCUMENTS

| | | | | |
|---|---|---|---|---|
| CN | 103384447 A | 11/2013 | | |
| CN | 103298473 A | 7/2014 | | |
| JP | 2-226736 A | 9/1990 | | |
| JP | 2007249014 A * | 9/2007 | | |
| LU | EP 1968360 A1 * | 9/2008 | | H05K 1/0271 |
| TW | I424388 B | 1/2014 | | |
| TW | 201407225 A | 2/2014 | | |

OTHER PUBLICATIONS

Roger A. Sauer "The peeling behavior of thin films with finite bending stiffness and the implications on gecko adhesion", The Journal of Adhesion, DOI: 10.1080/00218464.2011.596084, Oct. 29, 2010.

* cited by examiner

FLEXIBLE ELECTRONIC DEVICE

TECHNICAL FIELD

The disclosure relates in general to an electronic device, and more particularly to a flexible electronic device.

BACKGROUND

A manufacturing method of a flexible electronic device may include the following steps. Firstly, a flexible substrate is formed on a carrier, such as glass substrate. Then, a component is formed on the flexible substrate. Then, the flexible substrate is peeled off from the carrier. In generally, the stiffness of the component is larger than that of the flexible substrate. As a result, during the flexible substrate being peeling off, the flexible substrate is easy to generate crack due to the stiffness of the component being larger than that of the flexible substrate.

SUMMARY

According to one embodiment of the disclosure provides a flexible electronic device. The flexible electronic device may include a flexible substrate, at least one component and at least one stress buffer. The component may be disposed on the flexible substrate and has a lateral surface. The stress buffer may be disposed adjacent to the lateral surface of the component and has a stiffness which is getting larger toward the component.

According to one embodiment of the disclosure provides a flexible electronic device. The flexible electronic device may include a flexible substrate, a first component, a second component and a first stress buffer. The first component is disposed on the flexible substrate and has a first lateral surface. The second component is disposed on the flexible substrate and has a second lateral surface. The first stress buffer is disposed adjacent to the first lateral surface of the first component and has a stiffness which is getting larger toward the first component.

The above and other aspects of the disclosure will become better understood with regard to the following detailed description of the non-limiting embodiment(s). The following description is made with reference to the accompanying drawings.

Figure 1A:
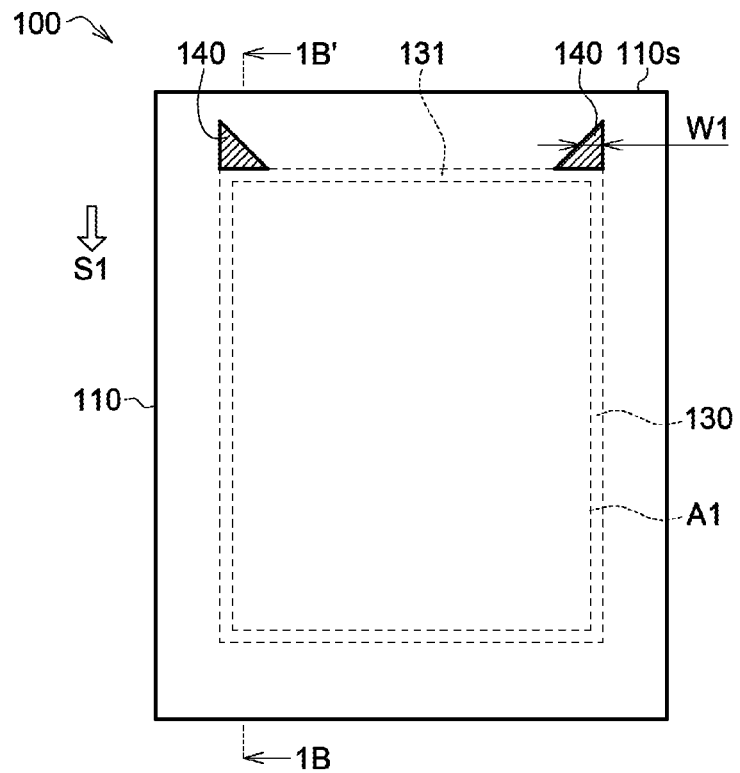
FIG. 1A illustrates a top view of a flexible electronic device formed on a carrier according to an embodiment of the disclosure.

In the following detailed description, for purposes of explanation, numerous details are set forth in order to provide a thorough understanding of the disclosed embodiments. It will be clear, that one or more embodiments may be practiced without these details. In other instances, well-known structures and devices are schematically shown in order to simplify the drawing.

DETAILED DESCRIPTION

Figure 1B:
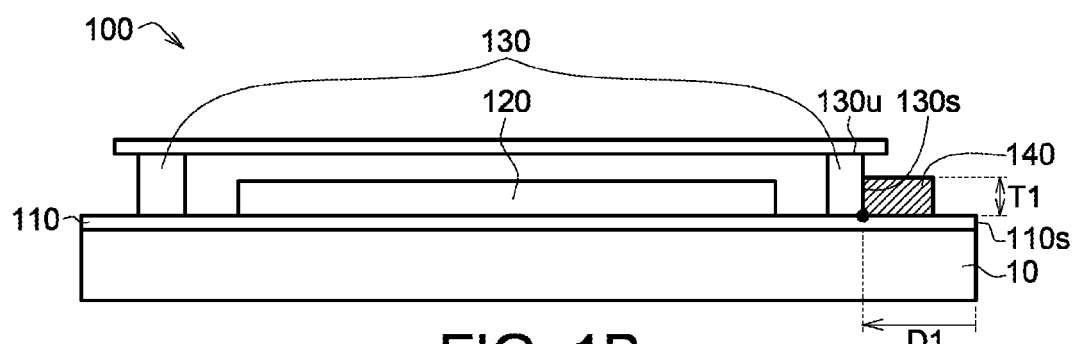
FIG. 1B illustrates a cross-sectional view of the flexible electronic device of FIG. 1A viewed along the direction 1B-1B'.

Referring to FIGS. 1A and 1B, FIG. 1A illustrates a top view of a flexible electronic device formed on a carrier according to an embodiment of the disclosure, and FIG. 1B illustrates a cross-sectional view of the flexible electronic device of FIG. 1A viewed along the direction 1B-1B'.

The flexible electronic device 100 is, for example, a display panel, a photovoltaic module, a sensor, etc. The flexible electronic device 100 is formed on the carrier 10. The flexible electronic device 100 includes a flexible substrate 110, at least one electronic element 120 (not illustrated in FIG. 1A), a component 130 and a plurality of the stress buffers 140.

The flexible substrate 110 may be made of, for example, polyimide (PI), polyethylene terephthalate (PET), polyethylene naphthalate (PEN), polycarbonate (PC), polypropylene (PP), ultra-thin glass (UTG), fiberglass reinforced plastic (FRP), or other suitable material.

The electronic element 120 is, for example, an electroluminescence device (EL device), a thin-film transistor (TFT), a solar cell, a touch sensor, a color filter, an optical film, etc. Under the circumstance of flexible electronic device 100 being a display panel, the flexible substrate 110 has a display area A1, and the electronic element 120 is formed on the display area A1 of the flexible substrate 110 and surrounded by the component 130. In the present embodiment, the component 130 is, for example, a sealing material (or sealant) or a filling material for preventing moisture destroying the electronic element 120. In another embodiment, the component 130 may be a side wall barrier (SWB) of OLED display panel.

In addition, the stress buffer 140 is formed on a lateral surface 130s of the component 130. In the present embodiment, the entire stress buffer 140 may be formed on a lateral surface 130s of the component 130, that is, the stress buffer 140 may not be formed above an upper surface 130u of the component 130, such that a peeling force between the carrier 10 and the flexible substrate 110 may be reduced, and accordingly the flexible substrate 110 may be easily peeled off from the carrier 10.

As illustrated in FIG. 1B, the stress buffer 140 may contact with the component 130. In addition, the stiffness of each stress buffer 140 may be gradually changed. "Stiffness" is an extensive property of a solid body dependent on the material, the shape and boundary conditions. In an embodiment, the stiffness of the stress buffer 140 may be equal or less than the stiffness of the flexible substrate 110 and less than the stiffness of the component 130. Furthermore, as illustrated in FIG. 1A, each stress buffer 140 has a width W1 which is getting larger toward the component 130, and accordingly the stiffness of the stress buffer 140 may be getting larger toward the component 130. As a result, during the flexible substrate 110 being peeled off from the carrier 10 along a peeling direction S1 from a lateral surface 110s of the flexible substrate 110 toward the component 130, the flexible substrate 110 may be integrally peeled off from the carrier 10, that is, conductive wires (not illustrated) formed on the flexible substrate 110 and the flexible substrate 110 may be prevented from generating crack or being broken.

Figure 2:
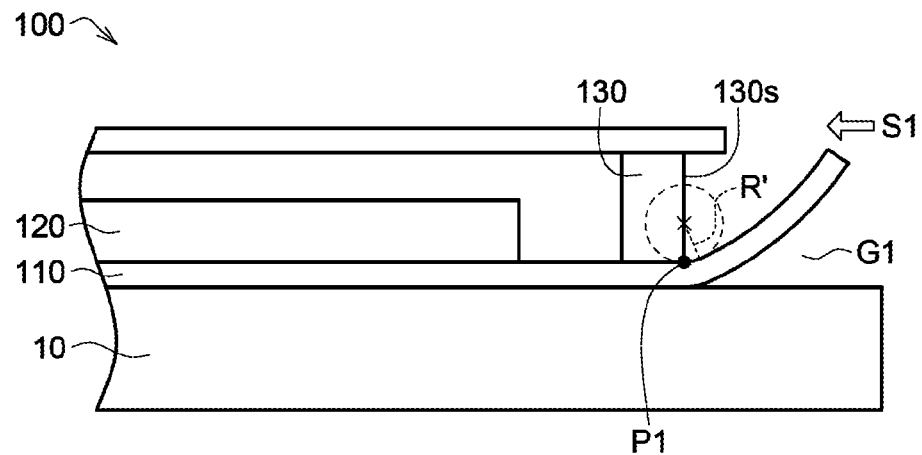
FIG. 2 illustrates a cross-sectional view of the flexible electronic device without the stress buffer being peeled off from the carrier.

Referring to FIG. 2, a cross-sectional view of the flexible electronic device without the stress buffer being peeled off from the carrier is illustrated. The flexible substrate 110 may be peeled off from the carrier 10 along the peeling direction S1. During the flexible substrate 110 being peeled off from the carrier 10, a gap G1 is formed between the flexible substrate 110 and the carrier 10. As illustrated in FIG. 2, without stress buffer 140, the bending curvature 1/R' (the R' represents curvature radius) of the point P1 of the flexible substrate 110 being peeled off from the carrier 10 is relatively large and thus a peeling stress of a point P1 or neighborhood thereof becomes larger. The point P1 is a contact point between the lateral surface 130s of the component 130 and the flexible substrate 110.

Figure 3:
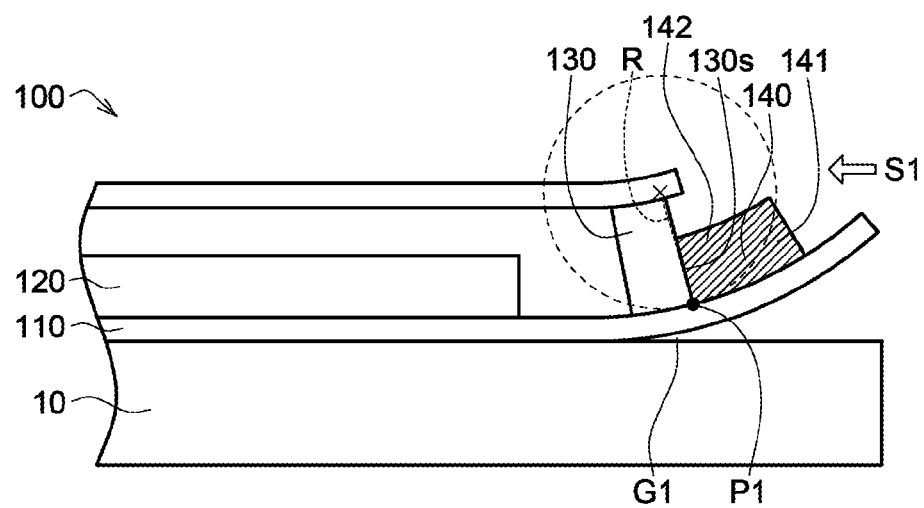
FIG. 3 illustrates a cross-sectional view of the flexible electronic device of FIG. 1B being peeled off from the carrier.

Referring to FIG. 3, a cross-sectional view of the flexible electronic device of FIG. 1B being peeled off from the carrier is illustrated. The stress buffer 140 includes a front portion 141 and a rear portion 142, wherein the peeling direction S1 is the direction from the front portion 141 toward the rear portion 142. Due to the design of the stress buffer 140, the bending curvature 1/R (the R represents curvature radius) of the point P1 becomes less, and thus the peeling stress between the flexible substrate 110 and the component 130 (for example, the peeling stress of the point P1 or neighborhood thereof) may be reduced. As a result, the conductive wires (not illustrated) formed on the flexible substrate 110 and the flexible substrate 110 may be prevented from generating crack or being broken.

In addition, in another embodiment, the stress buffer 140 of the flexible electronic device 100 may be replaced by one of the stress buffers 240 to 840 and 841 as mentioned below, and obtains the similar effect on reducing the peeling stress.

Figure 4:
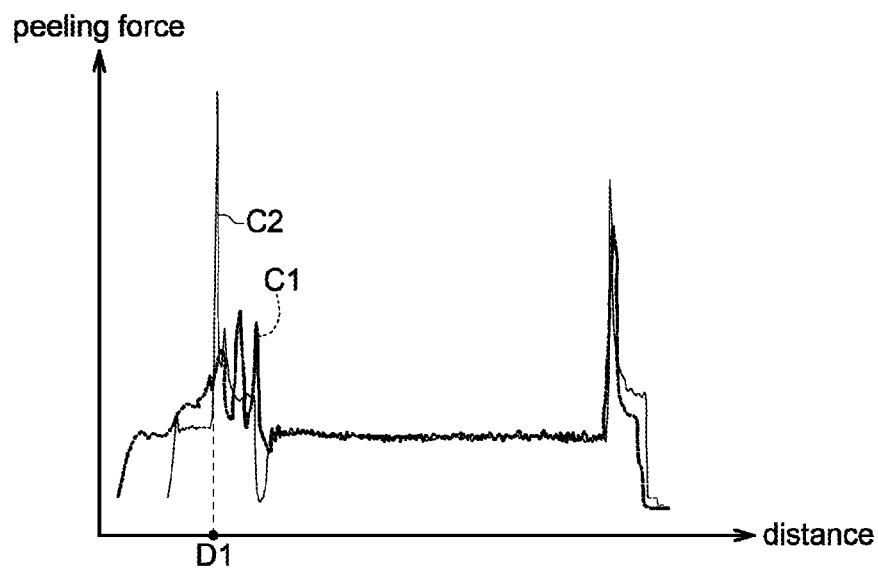
FIG. 4 illustrates a diagram of the peeling force between the flexible substrate and the carrier.

Referring to FIGS. 3 and 4, FIG. 4 illustrates a diagram of the peeling force between the flexible substrate and the carrier. A curve C1 represents the peeling force between the flexible substrate 110 and the carrier 10, and a curve C2 represents the peeling force between the flexible substrate 110 and the carrier 10 under omitting the stress buffers 140. In the curves C1 and C2, the maximum peeling force occurs around the point P1 (illustrated in FIG. 1B or 3) between the flexible substrate 110 and the lateral surface 130s of the component 130. Symbol "D1" of FIG. 4 represents the distance between the point P1 and the lateral surface 110s of the flexible substrate 110 of FIG. 1B. In comparison with the curve C2, the peeling force of the point P1 or neighborhood thereof of the curve C1 is lower due to the design of the stress buffers 140. As a result, the conductive wires (not illustrated) formed on the flexible substrate 110 and the flexible substrate 110 may be prevented from generating crack or being broken.

In the present embodiment, the number of the stress buffers 140 is two (as illustrated in FIG. 1A), and the two stress buffers 140 are located at two ends of an edge 131 of the component 130. In addition, each stress buffer 140 is, for example, the triangular prism. As illustrated in FIG. 1A, in top view, the contours of each stress buffer 140 is a triangle.

Figure 5:
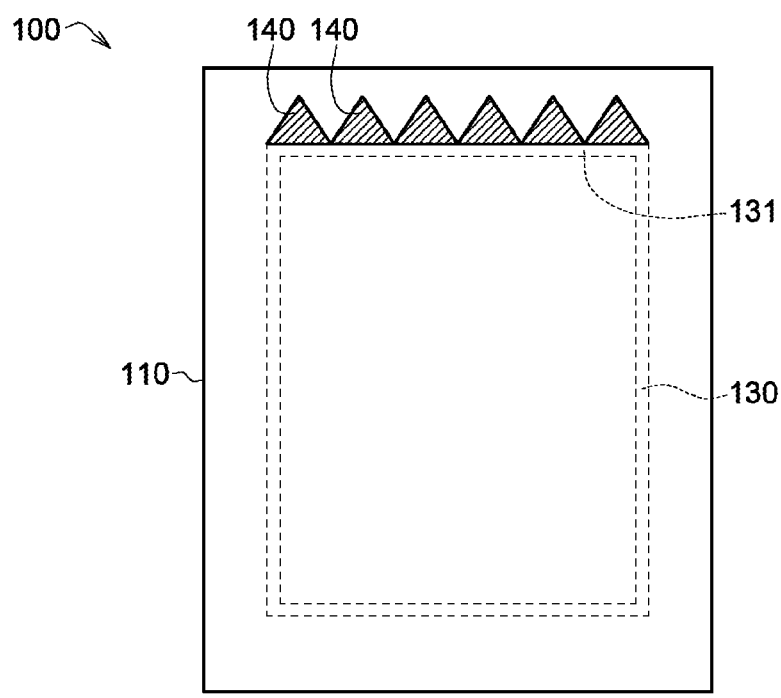
FIGS. 5 to 7 illustrate top views of the flexible electronic devices according to several embodiments of the disclosure.
Figure 6:
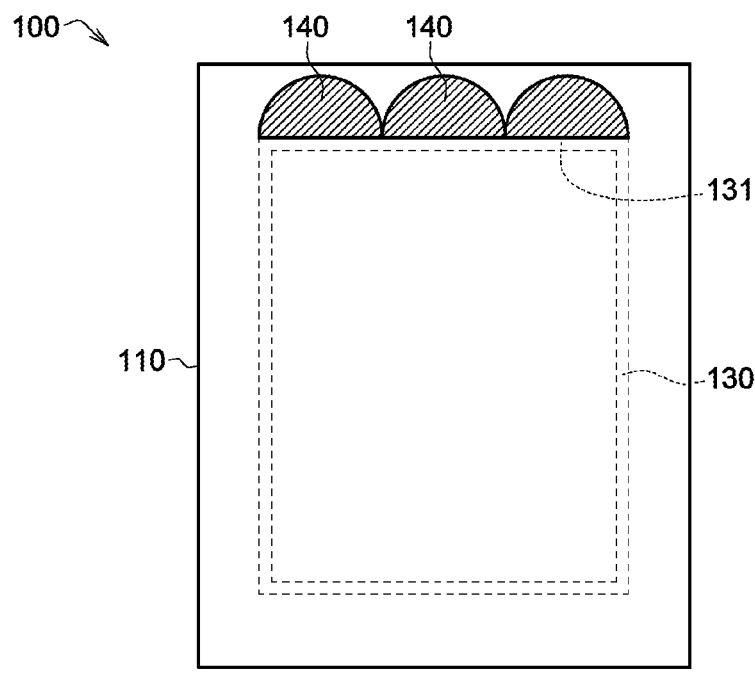
Figure 7:
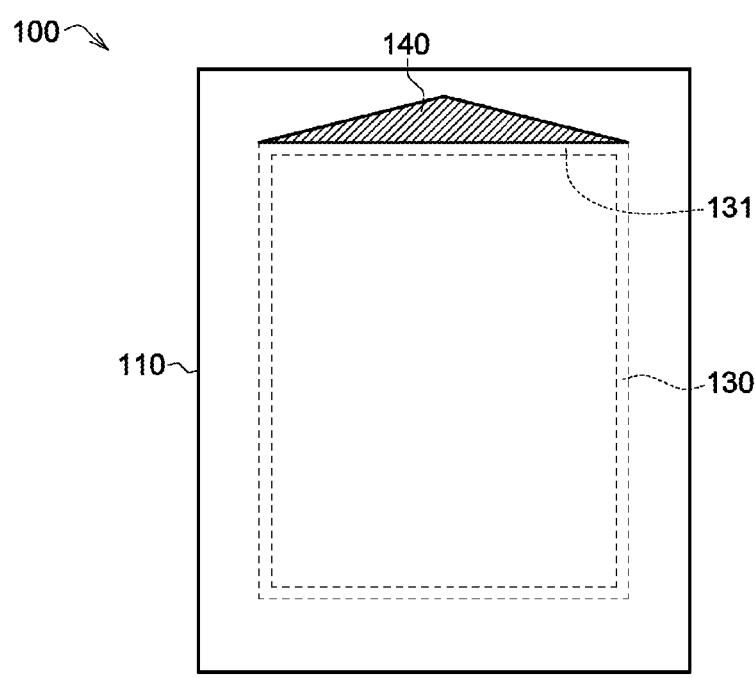

Referring to FIGS. 5 to 7, top views of the flexible electronic devices according to several embodiments of the disclosure are illustrated. As illustrated in FIG. 5, the stress buffers 140 are arranged along the edge 131 of the component 130, and adjacent two stress buffers 140 may contact with each other. In another embodiment, adjacent two stress buffers 140 may be separated by each other. As illustrated in FIG. 6, in top view, the contours of each stress buffer 140 is an arc. As illustrated in FIG. 7, the number of the stress buffer 140 may be single and correspondingly disposed on the entire edge 131 or a portion of the edge 131.

Figure 8:
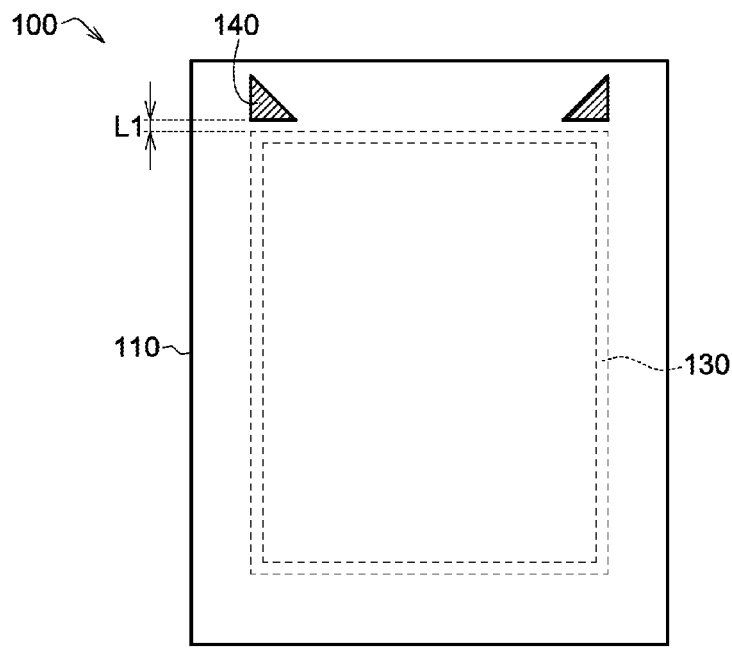
FIGS. 8 to 10 illustrate top views of the flexible electronic devices according to several embodiments of the disclosure.
Figure 9:
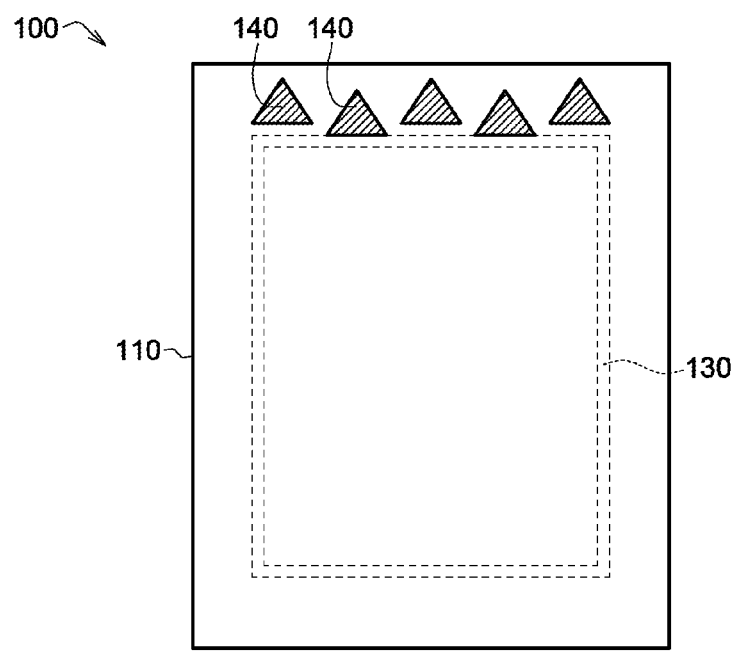
Figure 10:
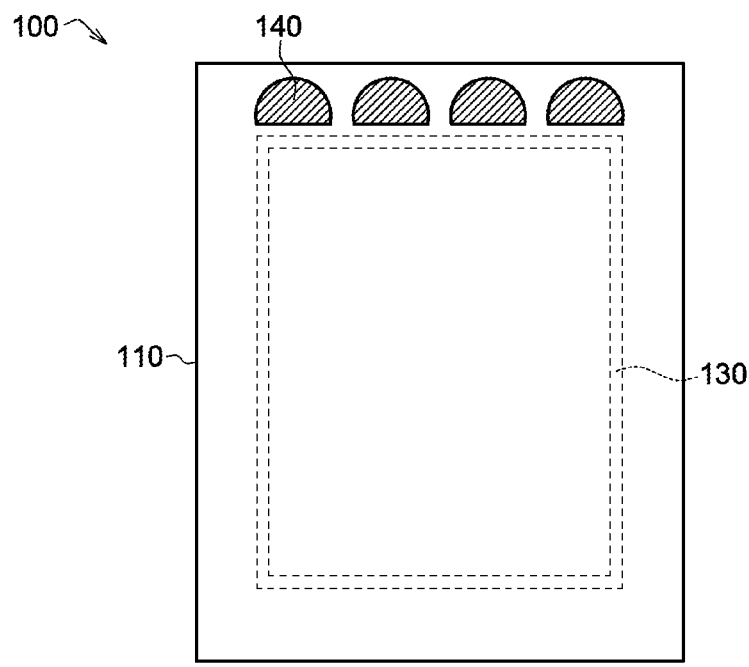

Referring to FIGS. 8 to 10, top views of the flexible electronic devices according to several embodiments of the disclosure are illustrated. As illustrated in FIGS. 8-10, at least one of the stress buffers 140 may be separated from the component 130. For example, as illustrated in FIG. 8, all of the stress buffers 140 are separated from the component 130. In addition, after the stress buffer 140 is separated from the component 130, an interval L1 between the stress buffer 140 and the component 130 may be less than or equal to a thickness T1 (as illustrated in FIG. 1B) of the component 130, and accordingly the effect on reducing the peeling stress may be generated. As illustrated in FIG. 9, some of the stress buffers 140 may contact with the component 130, and some of the stress buffers 140 may be separated from the component 130. In another embodiment, one of the stress buffers 140 contacts the component 130, or one of the stress buffers 140 is separated from the component 130. As illustrated in FIG. 10, the stress buffers 140 are separated from the component 130, and, in top view, the contours of each stress buffer 140 is an arc.

As described above, the number of the stress buffer 140 may be single or several. In top view, the stress buffer 140 has a contour, such as a straight line, a curved line or combination thereof. For example, in top view, the contour of the stress buffer 140 may be arc, semicircle, ellipse, triangle, rectangle, trapezoid, etc. In addition, two of the stress buffers 140 may be shaped as the same shapes, similar shapes or different shapes. The stress buffers 140 may be arranged along at least one edge of the component 130. Two of the stress buffers 140 may contact with each other or be separated from each other. In addition, the stress buffer 140 may be made of a material such as photoresist, foaming material, solidified adhesive, or combination thereof. In terms of the stress buffer 140 being composite materials, the materials may be stacked each other, or arranged in the same level.

Figure 11A:
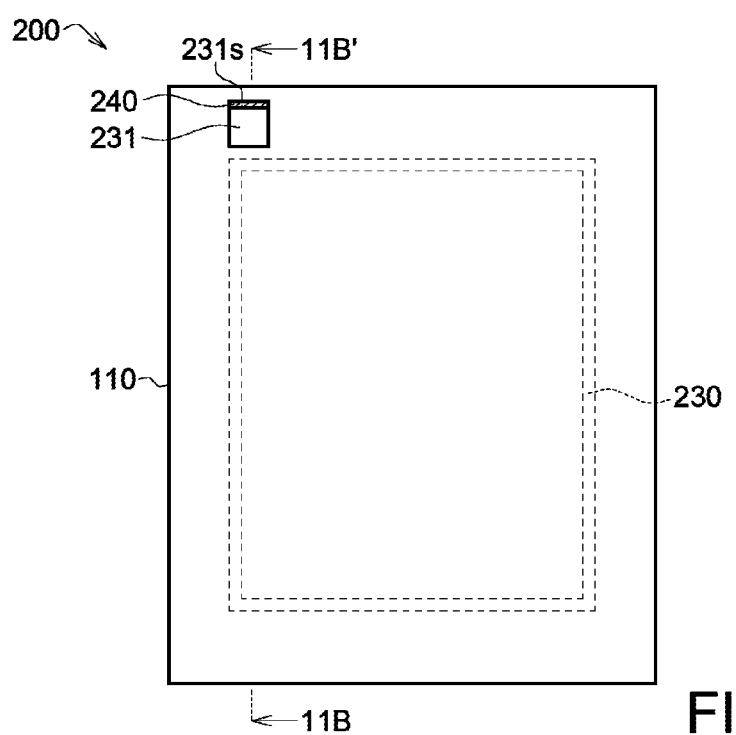
FIG. 11A illustrates a top view of a flexible electronic device according to another embodiment of the disclosure.
Figure 11B:
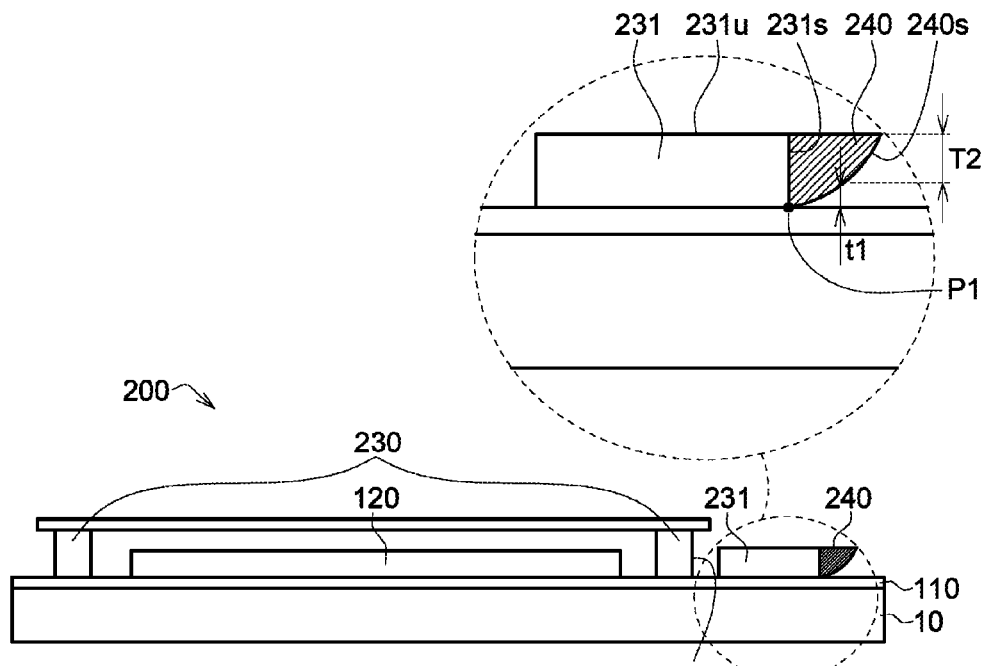
FIG. 11B illustrates a cross-sectional view of the flexible electronic device of FIG. 11A viewed along the direction 11B-11B'.

Referring to FIGS. 11A and 11B, FIG. 11A illustrates a top view of a flexible electronic device according to another embodiment of the disclosure, and FIG. 11B illustrates a cross-sectional view of the flexible electronic device of FIG. 11A viewed along the direction 11B-11B'.

The flexible electronic device 200 includes the flexible substrate 110, at least one electronic element 120, a first component 230, a second component 231 and a stress buffer 240. The second component 231 may be an electronic component such as a chip.

In the present embodiment, the stress buffer 240 is disposed adjacent to a lateral surface 231s of the second component 231. The stress buffer 240 has an outer surface 240s. The outer surface 240s is, for example, a curved surface having the same curvature or a variation curvature. For example, the stress buffer 240 is a one quarter cylinder which has the same curvature.

As illustrated in FIG. 11B, since the stress buffer 240 has a thickness T2 which is getting larger toward the second component 231, a distance t1 between the outer surface 240s and the flexible substrate 110 is getting smaller toward the second component 231, and the stiffness of the stress buffer 240 is getting larger toward the second component 231. As a result, during the flexible substrate 110 being peeled off from the carrier 10 along the peeling direction S1 (illustrated in FIG. 12), the conductive wires (not illustrated) formed on the flexible substrate 110 and the flexible substrate 110 may be prevented from generating crack or being broken.

The stress buffer 240 is formed on the lateral surface 231s of the second component 231. In the present embodiment, the entire stress buffer 240 may be formed on a lateral surface 231s of the second component 231. Since the stress buffer 240 is not formed on an upper surface 231u of the second component 231, the required peeling force between the carrier 10 and the flexible substrate 110 may be reduced, and accordingly the flexible substrate 110 may be easily peeled off from the carrier 10. In addition, in comparison with the design of omitting stress buffer 240, the peeling stress of the point P1 or neighborhood thereof of FIG. 11B may be reduced by about 33%-43%.

In an embodiment, the number of the stress buffer 240 may be the same as that of the second component 231. For example, the number of the second component 231 may be more than one; under such design, the number of the stress buffer 240 may be more than one. In other embodiment, several stress buffers 240 may be disposed on one second component 231. Alternatively, one stress buffer 240 may be corresponding to several second components 231. In addition, the stress buffer 240 may be made of a material similar to that of the stress buffer 140. In another embodiment, the stress buffer 240 of the flexible electronic device 200 may be replaced by the stress buffer 140 as mentioned above. In other embodiment, the flexible electronic device 200 may further include the stress buffer 140 disposed adjacent to the lateral surface 230s of the first component 230.

Figure 12:
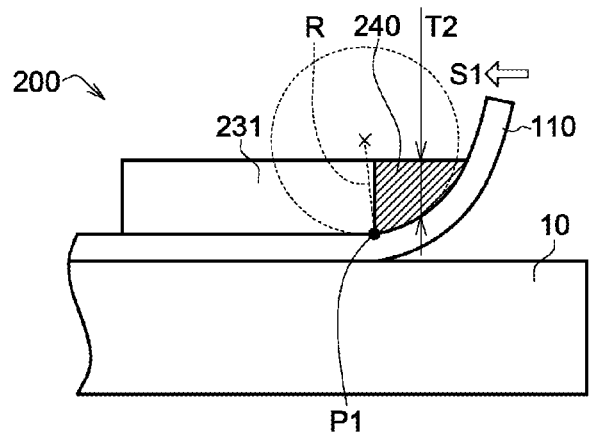
FIG. 12 illustrates a cross-sectional view of the flexible electronic device of FIG. 11B being peeled off from the carrier.

FIG. 12 illustrates a cross-sectional view of the flexible electronic device of FIG. 11B being peeled off from the carrier. Since the stress buffer 240 has the thickness T2 which is getting larger toward the second component 231, during the flexible substrate 110 being peeled off from the carrier 10 along the peeling direction S1, the maximum bending curvature 1/R (the R represents curvature radius) of the flexible substrate 110 may be reduced (if the stress buffer 240 is omitted, the maximum bending curvature 1/R is larger). As a result, during the flexible substrate 110 being peeled off from the carrier 10 along the peeling direction S1, the conductive wires (not illustrated) formed on the flexible substrate 110 and the flexible substrate 110 may be prevented from generating crack or being broken.

Figure 13:
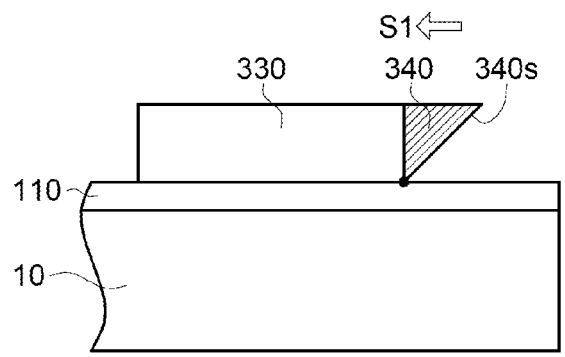
FIG. 13 illustrates a cross-sectional view of a flexible electronic device according to another embodiment of the disclosure.

FIG. 13 illustrates a cross-sectional view of a flexible electronic device according to another embodiment of the disclosure. In the present embodiment, the stress buffer 340 is a triangular prism and the outer surface 340s of the stress buffer 340 is plane.

In an embodiment, since the stiffness of the stress buffer 340 is getting larger toward the component 330, during the flexible substrate 110 being peeled off from the carrier 10 along the peeling direction S1, the peeling stress may be reduced, and the flexible substrate 110 may be integrally peeled off from the carrier 10, that is, the conductive wires (not illustrated) formed on the flexible substrate 110 and the flexible substrate 110 may be prevented from generating crack or being broken.

Figure 14:
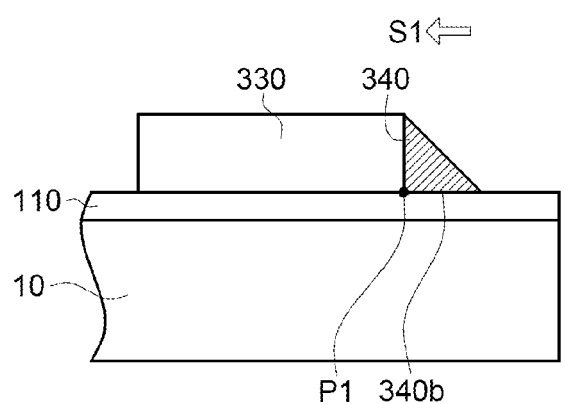
FIG. 14 illustrates a cross-sectional view of a flexible electronic device according to another embodiment of the disclosure.

FIG. 14 illustrates a cross-sectional view of a flexible electronic device according to another embodiment of the disclosure. In the present embodiment, the stress buffer 340 is a triangular prism and has a lower surface 340b, wherein the entire lower surface 340b contacts the flexible substrate 110. In one embodiment, in comparison with the design of omitting stress buffer 340, the peeling stress of the point P1 or neighborhood thereof of FIG. 14 may be reduced by about 6%-16%.

Figure 15:
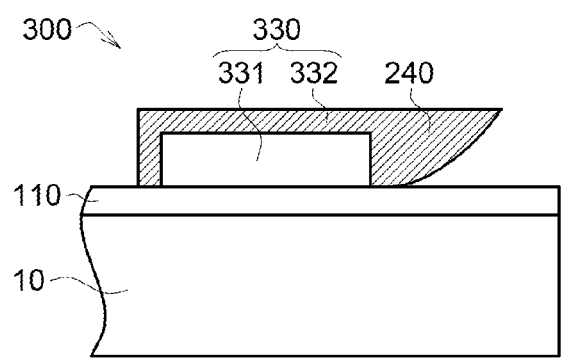
FIG. 15 illustrates a cross-sectional view of a flexible electronic device according to another embodiment of the disclosure.

FIG. 15 illustrates a cross-sectional view of a flexible electronic device according to another embodiment of the disclosure. The flexible electronic device 300 includes the flexible substrate 110, at least one electronic element 120 (not illustrated), a component 330 and a stress buffer 240. In the present embodiment, the component 330 may be an electronic component includes a chip 331 and a molding compound 332 enveloping the chip 331, wherein the stress buffer 240 is a portion of the molding compound 332. That is, the stress buffer 240 and the molding compound 332 are formed in the same molding process.

Figure 16:
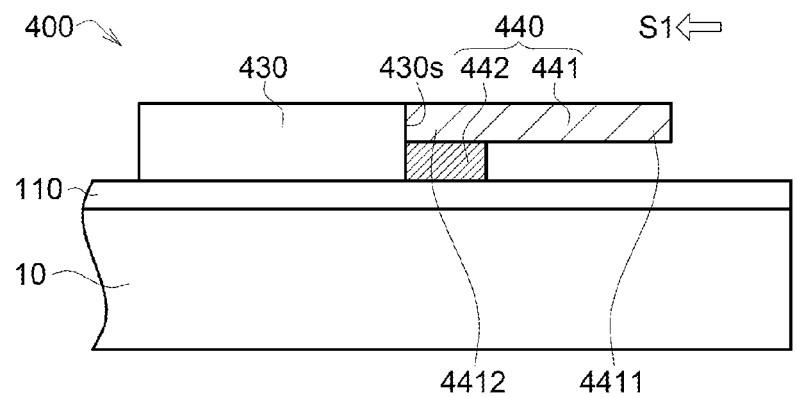
FIG. 16 illustrates a cross-sectional view of a flexible electronic device according to another embodiment of the disclosure.

FIG. 16 illustrates a cross-sectional view of a flexible electronic device according to another embodiment of the disclosure. The flexible electronic device 400 includes the flexible substrate 110, at least one electronic element 120 (not illustrated), the component 430 and a stress buffer 440. In the present embodiment, the stress buffer 440 is disposed adjacent to the lateral surface 430s of the component 430 and includes a flexible structure 441 and an adhesive 442, wherein the adhesive 442 is disposed between the flexible substrate 110 and the flexible structure 441.

The flexible structure 441 includes a front portion 4411 and a rear portion 4412, wherein the peeling direction S1 is the direction from the front portion 4411 toward the rear portion 4412. The adhesive 442 is disposed on the rear portion 4412 of the flexible structure 441, and a space between the front portion 4411 of the flexible structure 441 and the flexible substrate 110 is formed, such that the stress buffer 440 has the stiffness which is getting larger from the front portion 4411 toward the rear portion 4412. As a result, during the flexible substrate 110 being peeled off from the carrier 10, the conductive wires (not illustrated) formed on the flexible substrate 110 and the flexible substrate 110 may being prevented from generating crack and being broken.

In one embodiment, the flexible structure 441 may be made of a material similar to that of the stress buffer 140. In addition, the flexible structure 441 may be shaped as a structure similar to that of the stress buffer 140 or stress buffer 240. The number of the stress buffer 440 may be the same as that of the component 430. In another embodiment, the number of the component 430 may be more than one; under such design, the number of the stress buffer 440 may be more than one. Alternatively, several stress buffers 440 may be corresponding to one component 430. Alternatively, one stress buffer 440 may be corresponding to several components 430.

Figure 17:
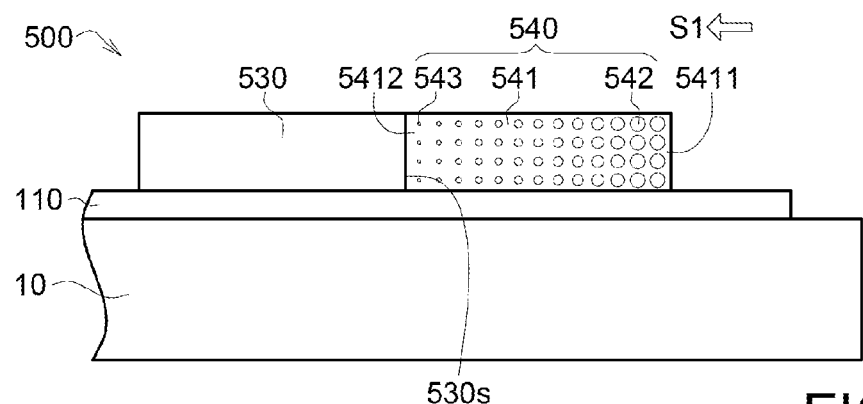
FIG. 17 illustrates a cross-sectional view of a flexible electronic device according to another embodiment of the disclosure.

FIG. 17 illustrates a cross-sectional view of a flexible electronic device according to another embodiment of the disclosure. The flexible electronic device 500 includes the flexible substrate 110, at least one electronic element 120 (not illustrated), the component 530 and a stress buffer 540. In the present embodiment, the stress buffer 540 is disposed adjacent to the lateral surface 530s of the component 530 and includes a buffer body 541, a plurality of voids 542 and a plurality of smaller voids 543.

The buffer body 541 includes a front portion 5411 and a rear portion 5412, wherein the peeling direction S1 is the direction from the front portion 5411 toward the rear portion 5412. The voids 542 and the smaller voids 543 are distributed within the buffer body 541, wherein the voids 542 are distributed within the front portion 5411 of the buffer body 541, and the smaller voids 543 are distributed within the rear portion 5412 of the buffer body 541, such that the stress buffer 540 has the stiffness which is getting larger from the front portion 5411 toward the rear portion 5412. As a result, during the flexible substrate 110 being peeled off from the carrier 10 in the present embodiment, the conductive wires (not illustrated) formed on the flexible substrate 110 and the flexible substrate 110 may being prevented from generating crack or being broken.

The number of the stress buffers 540 may be the same as that of the component 530. In another embodiment, the number of the component 530 may be more than one; under such design, the number of the stress buffer 540 may be more than one. Alternatively, several stress buffers 540 may be corresponding to one component 530. Alternatively, one stress buffer 540 may be corresponding to several components 530. In addition, the buffer body 541 may be made of a material similar to that of the stress buffer 140.

Figure 18:
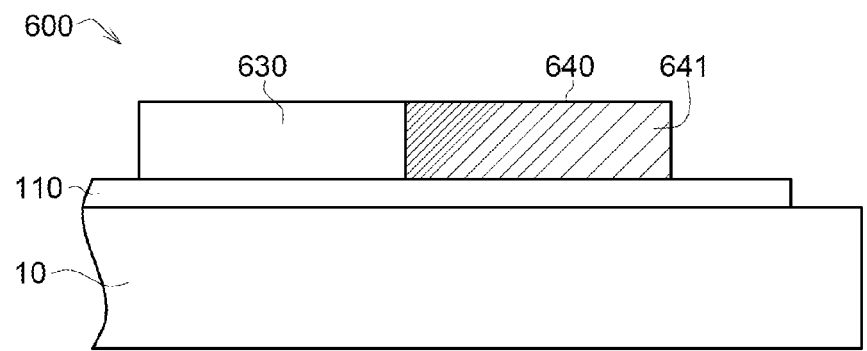
FIG. 18 illustrates a cross-sectional view of a flexible electronic device according to another embodiment of the disclosure.

FIG. 18 illustrates a cross-sectional view of a flexible electronic device according to another embodiment of the disclosure. The flexible electronic device 600 includes the flexible substrate 110, at least one electronic element 120 (not illustrated), the component 630 and a stress buffer 640.

The stress buffer 640 has a hardness which is getting larger toward the component 630, such that the stiffness of the stress buffer 640 is getting larger toward the component 630 from a front portion 641 of the stress buffer 640. As a result, during the flexible substrate 110 being peeled off from the carrier 10, the conductive wires (not illustrated) formed on the flexible substrate 110 and the flexible substrate 110 may being prevented from generating crack.

In addition, the number of the stress buffers 640 may be the same as that of the component 630. In another embodiment, the number of the component 630 may be more than one; under such design, the number of the stress buffer 640 may be more than one. Alternatively, several stress buffers 640 may be corresponding one component 630. Alternatively, one stress buffer 640 may be corresponding to several components 630. In addition, the stress buffer 640 may be made of a material similar to that of the stress buffer 140.

Figure 19:
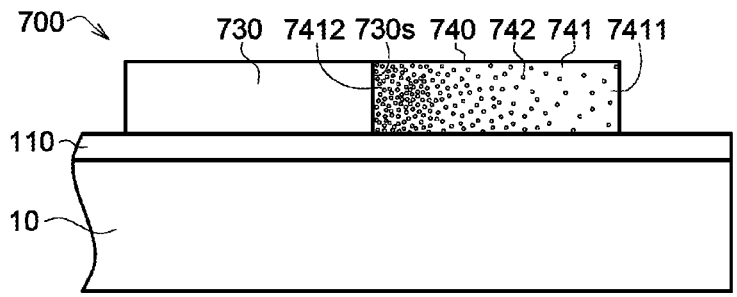
FIG. 19 illustrates a cross-sectional view of a flexible electronic device according to another embodiment of the disclosure.

FIG. 19 illustrates a cross-sectional view of a flexible electronic device according to another embodiment of the disclosure. The flexible electronic device 700 includes the flexible substrate 110, at least one electronic element 120 (not illustrated), the component 730 and a stress buffer 740. In the present embodiment, the stress buffer 740 is disposed adjacent to the lateral surface 730s of the component 730, and includes a buffer body 741 and a plurality of voids 742 distributed within the buffer body 741.

The density of the voids 742 distributed within the rear portion 7412 of the buffer body 741 is larger than the density of the voids 742 distributed within the front portion 7411 of the buffer body 741, such that the stiffness of the stress buffer 740 is getting larger toward the component 730. As a result, during the flexible substrate 110 being peeled off from the carrier 10, the conductive wires (not illustrated) formed on the flexible substrate 110 and the flexible substrate 110 may being prevented from generating crack or being broken.

In addition, the number of the stress buffers 740 may be the same as that of the component 730. In another embodiment, the number of the component 730 may be more than one; under such design, the number of the stress buffer 740 may be more than one. Alternatively, several stress buffers 740 may be corresponding to one component 730. Alternatively, one stress buffer 740 may be corresponding to several components 730.

Figure 20A:
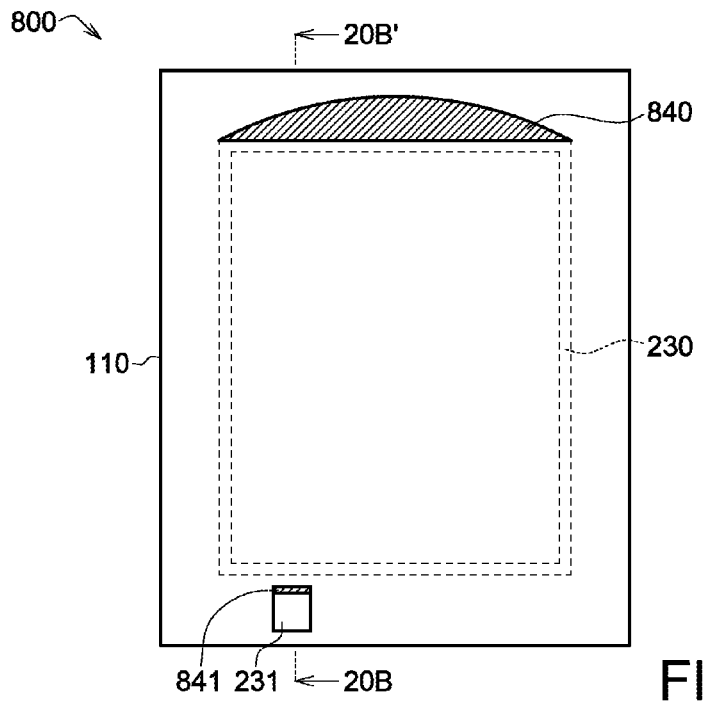
FIG. 20A illustrates a top view of a flexible electronic device according to another embodiment of the disclosure.
Figure 20B:
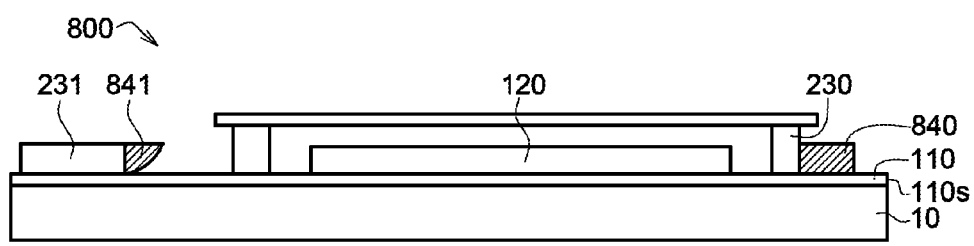
FIG. 20B illustrates a cross-sectional view of the flexible electronic device of FIG. 20A viewed along the direction 20B-20B'.

Referring to FIGS. 20A and 20B, FIG. 20A illustrates a top view of a flexible electronic device according to another embodiment of the disclosure, and FIG. 20B illustrates a cross-sectional view of the flexible electronic device of FIG. 20A viewed along the direction 20B-20B'.

The flexible electronic device 800 includes the flexible substrate 110, at least one electronic element 120, the first component 230, a first stress buffer 840, the second component 231 and a second stress buffer 841. In the present embodiment, the flexible electronic device 800 includes the first stress buffer 840 disposed adjacent to the first component 230 and the second stress buffer 841 disposed adjacent to the second component 231. The stiffness of the second component 231 may be larger than that of the first component 230. In other embodiments, the first stress buffer 840 may be selectively omitted and the second stress buffer 841 may be disposed adjacent to the second component 231.

Figure 21A:
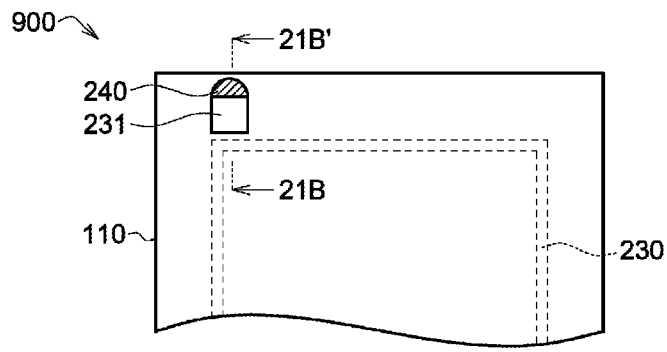
FIG. 21A illustrates a top view of a flexible electronic device according to another embodiment of the disclosure.
Figure 21B:
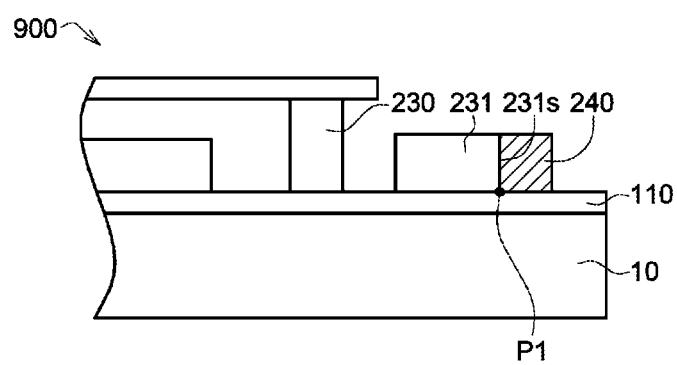
FIG. 21B illustrates a cross-sectional view of the flexible electronic device of FIG. 21A viewed along the direction 21B-21B'.

Referring to FIGS. 21A and 21B, FIG. 21A illustrates a top view of a flexible electronic device according to another embodiment of the disclosure, and FIG. 21B illustrates a cross-sectional view of the flexible electronic device of FIG. 21A viewed along the direction 21B-21B'.

The flexible electronic device 900 includes the flexible substrate 110, at least one electronic element 120 (not illustrated), the first component 230, the second component 231 and the stress buffer 240. In the present embodiment, the stress buffer 240 is disposed adjacent to the lateral surface 231s of the second component 231. In top view, the stress buffer 240 is a semicircle, for example. The stiffness of the second component 231 may be larger than that of the first component 230. In one embodiment, in comparison with the design of omitting stress buffer 240, the peeling stress of the point P1 or neighborhood thereof of FIG. 21B may be reduced by about 60%-70%.

It will be clear that various modifications and variations can be made to the disclosed embodiments. It is intended that the specification and examples be considered as exemplary only, with a true scope of the disclosure being indicated by the following claims and their equivalents.

What is claimed is:

1. A flexible electronic device, comprising:
a flexible substrate;
at least one component disposed on the flexible substrate and having a lateral surface; and
at least one stress buffer disposed adjacent to the lateral surface of the component, wherein the stress buffer has a stiffness which is getting larger toward the component,
wherein the stiffness of the stress buffer is less than a stiffness of the component,
wherein the stress buffer has a thickness which is getting larger toward the component, and
wherein the stress buffer has an outer surface, and a distance between the outer surface and the flexible substrate is getting smaller toward the component.

2. The flexible electronic device according to claim 1, wherein the component is an electronic component.

3. The flexible electronic device according to claim 2, wherein the electronic component comprises a chip and a molding compound enveloping the chip, and the stress buffer is a portion of the molding compound.

4. The flexible electronic device according to claim 1, wherein the component is a sealing material, a filling material, or a side wall barrier.

5. The flexible electronic device according to claim 4, wherein the flexible substrate has a display area, and the component surrounds the display area.

6. The flexible electronic device according to claim 1, wherein the stress buffer contacts with the component.

7. The flexible electronic device according to claim 1, wherein the stress buffer is separated from the component, and an interval between the lateral surface of the component and the stress buffer is less than or equal to a thickness of the component.

8. The flexible electronic device according to claim 1, wherein the stress buffer has a width which is getting larger toward the component.

9. The flexible electronic device according to claim 1, wherein the outer surface is a curved surface or a plane.

10. The flexible electronic device according to claim 1, wherein the stress buffer has a lower surface, and the entire lower surface contacts the flexible substrate.

11. A flexible electronic device, comprising:
a flexible substrate;
at least one component disposed on the flexible substrate and having a lateral surface; and
at least one stress buffer disposed adjacent to the lateral surface of the component,
wherein the stress buffer has a stiffness which is getting larger toward the component,
wherein the stiffness of the stress buffer is equal to or less than a stiffness of the flexible substrate and less than a stiffness of the component, and
wherein the stress buffer comprises a buffer body, a plurality of voids and a plurality of smaller voids, wherein the buffer body comprises a front portion and a rear portion, the rear portion is closer to the component than the front portion, the voids are distributed within the front portion of the buffer body, and the smaller voids are distributed within the rear portion of the buffer body.

12. A flexible electronic device, comprising:
a flexible substrate;
at least one component disposed on the flexible substrate and having a lateral surface; and
at least one stress buffer disposed adjacent to the lateral surface of the component,
wherein the stress buffer has a stiffness which is getting larger toward the component,
wherein the stiffness of the stress buffer is equal to or less than a stiffness of the flexible substrate and less than a stiffness of the component, and
wherein the stress buffer comprises a buffer body, the buffer body comprising a front portion, a rear portion and a plurality of voids distributed within the buffer body, the rear portion is closer to the component than the front portion, and a density of the voids distributed within the rear portion of the buffer body is larger than a density of the voids distributed within the front portion of the buffer body.

13. A flexible electronic device, comprising:
a flexible substrate;
at least one component disposed on the flexible substrate and having a lateral surface; and
at least one stress buffer disposed adjacent to the lateral surface of the component,
wherein the stress buffer has a stiffness which is getting larger toward the component,
wherein the stiffness of the stress buffer is equal to or less than a stiffness of the flexible substrate and less than a stiffness of the component,
wherein the stress buffer comprises a flexible structure and an adhesive, and the adhesive is disposed between the flexible substrate and the flexible structure, and the adhesive directly connects the flexible substrate and the flexible structure, and
wherein the adhesive is disposed on a rear portion of the flexible structure, and there is a space formed between a front portion of the flexible structure and the flexible substrate.

14. The flexible electronic device according to claim 1, wherein the stiffness of the stress buffer is equal to or less than the stiffness of the flexible substrate.

15. A flexible electronic device, comprising:
a flexible substrate;
at least one component disposed on the flexible substrate and having a lateral surface; and
a plurality of stress buffers only disposed adjacent to the lateral surface of the component, wherein each of the stress buffers has a stiffness which is getting larger toward the component,
wherein the stiffness of each of the stress buffers is equal to or less than a stiffness of the flexible substrate and less than a stiffness of the component,
wherein each of the stress buffers has a width which is getting larger toward the component, and each of the stress buffers has a fixed thickness.

* * * * *